United States Patent
Kato et al.

(10) Patent No.: US 10,115,746 B2
(45) Date of Patent: Oct. 30, 2018

(54) MANUFACTURING METHOD FOR ACTIVE MATRIX SUBSTRATE, ACTIVE MATRIX SUBSTRATE AND DISPLAY APPARATUS

(71) Applicant: Sakai Display Products Corporation, Sakai-shi, Osaka (JP)

(72) Inventors: Masahiro Kato, Sakai (JP); Satoru Utsugi, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 108 days.

(21) Appl. No.: 15/110,081

(22) PCT Filed: Jan. 8, 2014

(86) PCT No.: PCT/JP2014/050166
§ 371 (c)(1),
(2) Date: Jul. 6, 2016

(87) PCT Pub. No.: WO2015/104806
PCT Pub. Date: Jul. 16, 2015

(65) Prior Publication Data
US 2016/0336357 A1 Nov. 17, 2016

(51) Int. Cl.
*G02F 1/1333* (2006.01)
*H01L 27/12* (2006.01)
(Continued)

(52) U.S. Cl.
CPC ........ *H01L 27/1262* (2013.01); *G02F 1/1333* (2013.01); *G02F 1/1337* (2013.01);
(Continued)

(58) Field of Classification Search
None
See application file for complete search history.

(56) References Cited

U.S. PATENT DOCUMENTS

2007/0268438 A1 11/2007 Nakamura et al.
2012/0305925 A1* 12/2012 Misaki ............... H01L 29/7869
257/59
(Continued)

FOREIGN PATENT DOCUMENTS

JP    H8-146400 A    6/1996
JP    H11-352514 A   12/1999
(Continued)

*Primary Examiner* — Jessica M Merlin
*Assistant Examiner* — Mark Teets
(74) *Attorney, Agent, or Firm* — Rudy J. Ng; Bret E. Field; Bozicevic, Field & Francis LLP

(57) ABSTRACT

Provided is a manufacturing method for an active matrix substrate, capable of providing a hole for alignment at an interlayer dielectric film without possible etching of a substrate surface and abnormal electric discharge and of allowing the position of a formed film to be easily corrected to be aligned with the position of the film of the lowest layer, with high overlaying precision. Also provided are the active matrix substrate and a display apparatus comprising the active matrix substrate.

An interlayer dielectric film 14 of the active matrix substrate is formed using an SOG material with photosensitivity, and an adjustment hole 14b for adjustment of the patterns of a gate insulation film 15, a first semiconductor film 16, a second semiconductor film 17 and a source metal that are formed on the upper side of a substrate 10 and the interlayer dielectric film 14 is formed. The position of each film is adjusted while viewing an edge of the gate wiring 11 through the adjustment hole 14b.

6 Claims, 21 Drawing Sheets

(51) Int. Cl.
- *G02F 1/1368* (2006.01)
- *G02F 1/1335* (2006.01)
- *G02F 1/1337* (2006.01)
- *G02F 1/1343* (2006.01)
- *G02F 1/1362* (2006.01)
- *H01L 21/02* (2006.01)
- *H01L 21/311* (2006.01)
- *H01L 21/027* (2006.01)
- *H01L 21/66* (2006.01)

(52) U.S. Cl.
CPC ........ *G02F 1/1368* (2013.01); *G02F 1/13439* (2013.01); *G02F 1/133514* (2013.01); *G02F 1/133528* (2013.01); *G02F 1/136286* (2013.01); *H01L 21/0274* (2013.01); *H01L 21/02126* (2013.01); *H01L 21/02216* (2013.01); *H01L 21/02282* (2013.01); *H01L 21/311* (2013.01); *H01L 21/31127* (2013.01); *H01L 27/124* (2013.01); *H01L 27/1248* (2013.01); *G02F 2001/133354* (2013.01); *G02F 2001/136295* (2013.01); *G02F 2201/121* (2013.01); *G02F 2201/123* (2013.01); *H01L 22/20* (2013.01)

(56) References Cited

U.S. PATENT DOCUMENTS

2013/0216952 A1* 8/2013 Yokoyama ............ G03F 7/0757
                                                              430/286.1
2015/0138481 A1* 5/2015 Yamayoshi ......... H01L 27/1288
                                                              349/46

FOREIGN PATENT DOCUMENTS

| JP | 2009-86086 A | 4/2009 |
| JP | 4450834 B2 | 4/2010 |

* cited by examiner

F I G. 15
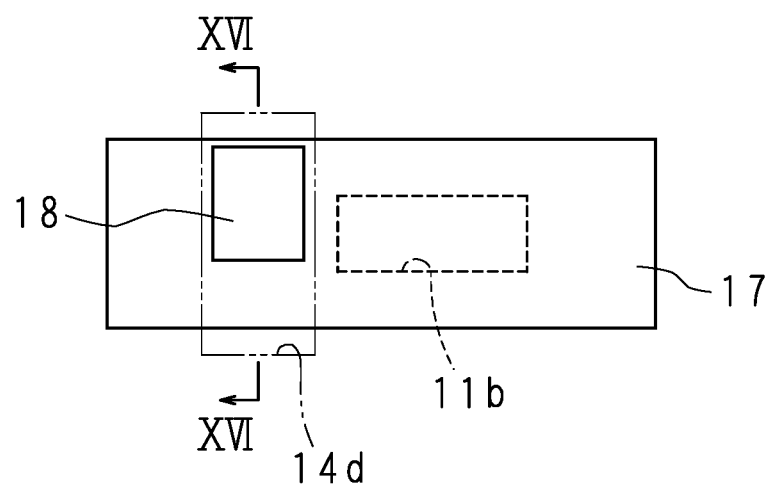

11  18

14a

18

MANUFACTURING METHOD FOR ACTIVE MATRIX SUBSTRATE, ACTIVE MATRIX SUBSTRATE AND DISPLAY APPARATUS

CROSS-REFERENCE TO RELATED APPLICATIONS

This application is the national phase under 35 U.S.C. § 371 of PCT International Application No. PCT/JP2014/050166 which has an International filing date of Jan. 8, 2014 and designated the United States of America.

BACKGROUND

1. Technical Field

The present invention relates to a manufacturing method for an active matrix substrate included in a television receiver, a personal computer and so forth, to the active matrix substrate and to a display apparatus including the active matrix substrate.

2. Description of Related Art

Among display apparatuses, a liquid crystal display apparatus has characteristics of being thin and consuming a small amount of electricity. Specifically, a liquid crystal display apparatus comprising an active matrix substrate having a switching element such as a thin film transistor (TFT) or the like for each pixel presents high performance including high contrast ratio and good response characteristics, and is thus preferably used for a television receiver, a personal computer, etc.

Multiple gate wirings (scanning wirings) and multiple source wirings (signal wirings), each of which crosses each of the gate wirings through an interlayer dielectric film, are formed on the active matrix substrate. The thin film transistor for switching a pixel is provided near the crossing part of the gate wiring and the source wiring.

Capacitance formed at the crossing part of the gate wiring and the source wiring (parasitic capacitance) is desired to be small, because it causes the deterioration of the display quality.

Japanese Patent No. 4450834 discloses the invention of an active matrix substrate in which the parasitic capacitance is reduced by an insulation film covering the gate wirings being configured as a multi-layered insulation film with a first insulator layer and a second insulator, in which the first insulator layer is constituted by an insulating material containing an organic constituent.

FIG. 20 is a schematic cross-sectional view illustrating a portion of a TFT structure of a prior art active matrix substrate according to Japanese Patent No. 4450834, etc.

As illustrated in FIG. 20, a gate electrode 11a (a part of a gate wiring 11) is formed on the glass substrate 10 of an active matrix substrate.

An interlayer dielectric film 14 constituted by SOG is formed to cover the substrate 10 and the peripheral part of the gate electrode 11a. At the inner side of the peripheral part of the gate electrode 11a, the interlayer dielectric film 14 has a contact hole 14a not covered by the interlayer dielectric film 14.

At forming the interlayer dielectric film 14 constituted by SOG, at first an SOG material is applied to form a coating film on the substrate 10 and the gate wiring 11 and then baked. Thereafter, a photoresist is formed on the coating film. The photoresist is exposed to light through a photomask and then developed to form a resist pattern. Next, the part of the coating film not covered by the resist undergoes etching, such as dry etching using mixed gas of tetrafluoromethane and oxygen, to form the contact holes 14a and so forth. Finally, the resist is removed.

A gate insulation film 15 is formed on the interlayer dielectric film 14 and the gate electrode 11a, and a first semiconductor film 16 is formed on the gate insulation film 15. In addition, a second semiconductor film 17 constituted by an $n^+$ film is formed to cover the first semiconductor film 16.

A resist pattern 18 is formed to pattern the first semiconductor film 16 and the second semiconductor film 17.

Additionally, a film made of Cu or the like is deposited using, for example, a sputtering method on the second semiconductor film 17 which is obtained by being patterned with the resist pattern 18, or on the gate insulation film 15 which is exposed by the removal of the first semiconductor film 16 and the second semiconductor film 17. The deposited film is patterned to form source metal (not depicted) including source electrodes and the source wirings.

In the TFT structure described above, the interlayer dielectric film 14 is provided between the gate wirings 11 and the source wirings, which allows for manufacturing of a high definition display panel without increase in resistance of the wirings and deterioration of TFT driving.

At patterning using a lithography device, the film which is formed over the gate wiring 11 is aligned with the edge of the pattern of the wiring 11 to correct the overlaying position.

The resist pattern 18 is corrected so as to correct the positions of patterns of the first semiconductor film 16 and the second semiconductor film 17 both of which will be formed subsequently. At this time, the distance from the edge of the gate wiring 11 to the resist pattern 18 is measured with a microscope. Based on the measured result, the photoresist is formed again and then the resist pattern 18 is formed again using a photomask. The part not covered by the resist pattern 18 is etched thereafter to obtain the patterned first semiconductor film 16 and second semiconductor film 17.

FIG. 21A is a schematic view illustrating the relationship between the positions of the resist pattern 18 and the gate wiring 11 in the case where the interlayer dielectric film 14 is not present. FIG. 21B is a schematic view illustrating the resist pattern 18 in the case where the interlayer dielectric film 14 is present.

As illustrated in FIG. 21A, if the interlayer dielectric film 14 constituted by SOG is not present, the edge of the gate wiring 11 is visible, which facilitates the position adjustment of the resist pattern 18.

If the interlayer dielectric film 14 constituted by SOG is provided, as illustrated in FIG. 21B, a colored film such as the first semiconductor film 16 or the second semiconductor film 17 formed over the gate wiring 11 prevents the edge of the gate wiring 11 from being viewed. As illustrated in FIG. 20, the interlayer dielectric film 14 is formed so as to cover the edge (tapered part) of the gate electrode 11a. Because a large portion of incident light may be reflected on the reflection films inside the triple-layered film composed of the gate insulation film 15, the first semiconductor film 16 and the second semiconductor film 17, and because there is the interlayer dielectric film 14 between the back side of the gate insulator 15 and the gate wiring 11, the edge of the gate wiring 11 may hardly be viewed.

Therefore, the resist pattern 18 has its position adjusted by the pattern of the interlayer dielectric film 14 (the contact hole 14a in FIG. 21B). The resist pattern 18 is thereby incorrectly placed with respect to the edge of the gate wiring 11, which deteriorates the precision of overlaying. Specifically, while high overlaying precision is required for adapting the display panel to a high definition digital video format, such as Super Hi-Vision (8K Ultra High Definition Television, for example), the prior art poses a problem in that such a requirement is difficult to be met with.

In addition, because each lithography apparatus is generally given its condition setting depending on the film as a reference processed by each apparatus, the change of the condition setting of the apparatus that processes the resist pattern on the interlayer dielectric film 14 requires the condition resetting of the apparatus that processes the resist pattern on the upper film, causing a problem in that the forming process is complicated accordingly.

A hole for position adjustment may possibly be formed at the interlayer dielectric film 14 while going across above the edge of the gate wiring 11. However, because the forming process of the interlayer dielectric film 14 includes the dry etching process, as described above, the substrate 10 may be etched when the interlayer dielectric film 14 is not provided at the tapered part of the gate electrode 11a. In addition, a defect can be caused by abnormal electric discharge at the tapered part of the gate electrode 11a, which decreases the yield.

Therefore, the prior art includes a problem in that the hole for alignment cannot be formed on the interlayer dielectric film 14 except for the part on the gate wiring 11.

The present invention is made in consideration of the above-described circumstances. An object of the present invention is to provide a manufacturing method of an active matrix substrate, the method being capable of creating without etching of a substrate surface and abnormal electric discharge, in an interlayer dielectric film, a hole for alignment and being capable of easily correcting the position of a formed film with respect to the position of the film of the lowest layer, with high overlaying precision. Also, an object of the present invention is to provide the active matrix substrate and a display apparatus comprising the active matrix substrate.

A method of manufacturing an active matrix substrate according to one embodiment of the present invention comprises: forming, on a substrate, a gate wiring and a source wiring which crosses the gate wiring at an upper layer than the gate wiring; forming a thin film transistor near a region where the gate wiring and the source wiring face each other; and forming an interlayer dielectric film containing a spin-on-glass (SOG) material in at least an area between the gate wiring and the source wiring in the region, wherein the interlayer dielectric film is formed using the SOG material with photosensitivity, and a hole for adjustment of a pattern of a film which is formed at an upper layer than the substrate and the interlayer dielectric film is formed.

In the embodiment, because the interlayer dielectric film is formed using an SOG material with photosensitivity, a dry etching process is not required for forming the film, which prevents the problems of etching of the substrate surface and abnormal electric discharge, and this allows an aperture for alignment to be formed at a portion other than a film on the lower side of the interlayer dielectric film, for example in the interlayer dielectric film itself. Accordingly the adjustment of overlaying can be conducted based on the pattern of the film of the lower layer, this improves the overlaying precision.

Therefore, according to the embodiment, as the active matrix substrate can be manufactured in the situation that the position adjustment is facilitated, defects are reduced and the yield is improved.

The method according to the embodiment of the present invention may comprise a step of forming the gate wiring on the substrate before forming the interlayer dielectric film, wherein the hole is formed to make an edge of the gate wiring visible.

In the embodiment, because overlaying is adjusted based on the edge of the gate wiring which is a layer provided right over the substrate, namely the lowest layer, the overlaying precision is further improved.

In the method according to the embodiment of the present invention, it is preferred that the hole is formed to go across above the edge of the gate wiring.

In the embodiment, the edge of the gate wiring is certainly visible.

The method according to the embodiment of the present invention may comprise a step of forming a semiconductor film at an upper layer than the gate wiring while viewing the edge of the gate wiring through the hole.

In the embodiment, the interlayer dielectric film and the semiconductor film can be patterned based on the pattern of the gate wiring, which improves the overlaying precision.

The method according to the embodiment of the present invention may comprise a step of forming a source metal which includes the source wiring or a source electrode at an upper layer than the semiconductor film while viewing the edge of the gate wiring through the hole In the embodiment, the interlayer dielectric film, the semiconductor film and the source metal can be patterned based on the pattern of the gate wiring, which improves the overlaying precision.

A method of manufacturing an active matrix substrate according to one embodiment of the present invention comprises: forming, on a substrate, a gate wiring and a source wiring which crosses the gate wiring at an upper layer than the gate wiring; and forming a thin film transistor near a region where the gate wiring and the source wiring face each other; further comprises: forming the gate wiring on the substrate; forming an interlayer dielectric film using an SOG material with photosensitivity on a surface of the region of the gate wiring crossing the source wiring; and depositing a film on the interlayer dielectric film, the substrate and the gate wiring while viewing an edge of the gate wiring.

In the embodiment, because the interlayer dielectric film is formed only at the crossing part of the gate wiring and the source wiring, the patterning can favorably be adjusted while viewing the edge of the gate wiring, when a film is deposited on the interlayer dielectric film as well as on the upper side of the substrate and the gate wiring not provided with the interlayer dielectric film.

In the method according to the embodiment of the present invention, it is preferred that the SOG material contains a diazonaphthoquinone derivative, a solvent, and at least two kinds of polysiloxanes with different rates of solubility to tetramethylammonium hydroxide water solution.

In the embodiment, the SOG material has good photosensitivity and the interlayer dielectric film has good thermal resistance, transparency and insulation property.

An active matrix substrate according to one embodiment of the present invention comprises: a gate wiring and a source wiring which crosses the gate wiring on the upper side of the gate wiring, formed on a substrate; a thin film transistor formed near a region where the gate wiring and the source wiring face each other; and an interlayer dielectric film containing a spin-on-glass (SOG) material and being interposed in at least an area between at least the gate wiring and the source wiring in the region, wherein the interlayer dielectric film is formed using the SOG material with photosensitivity and has a hole for adjustment of a pattern of a film formed at an upper layer than the substrate and the interlayer dielectric film.

In the embodiment, because the interlayer dielectric film is formed using the SOG material with photosensitivity, because dry etching is not required for forming the film, and because the problems of etching of the substrate surface and abnormal electric discharge are prevented, the hole for alignment is provided at a portion other than a film on the lower side of the interlayer dielectric film, for example in the interlayer dielectric film itself. Therefore, the upper film is precisely overlaid based on the pattern of the film of the lower layer.

A display apparatus according to one embodiment of the present invention comprises: the above-mentioned active matrix substrate, and an opposite substrate opposed to the active matrix substrate through the display medium layer.

In the embodiment, the display apparatus can be designed for higher definition because the display apparatus comprises the active matrix substrate described above.

According to the embodiment of the present invention, because the interlayer dielectric film is formed using the SOG material with photosensitivity, the hole for alignment can be provided in the interlayer dielectric film, namely at a portion other than a film on the lower side of the interlayer dielectric film, without etching of the substrate surface and abnormal electric discharge. The hole may be used for correcting the position of the film formed over the interlayer dielectric film to be aligned with the position of the lowest layer, and thus the film may be deposited with high overlaying precision.

Therefore, according to the embodiment of the present invention, the active matrix substrate can be manufactured while the position adjustment is facilitated, the occurrence of defects is suppressed and the yield is improved, so that the display apparatus may be designed for high definition and be adapted for a larger size.

The above and further objects and features will more fully be apparent from the following detailed description with accompanying drawings.

BRIEF DESCRIPTION OF THE SEVERAL VIEWS OF THE DRAWINGS

FIG. 15 is a plan view illustrating the relationship between the second semiconductor film and the contact hole when the second semiconductor film is formed.

DETAILED DESCRIPTION

The present invention will be described in detail below with reference to the drawings illustrating the embodiments thereof.

Embodiment 1

Figure 1:
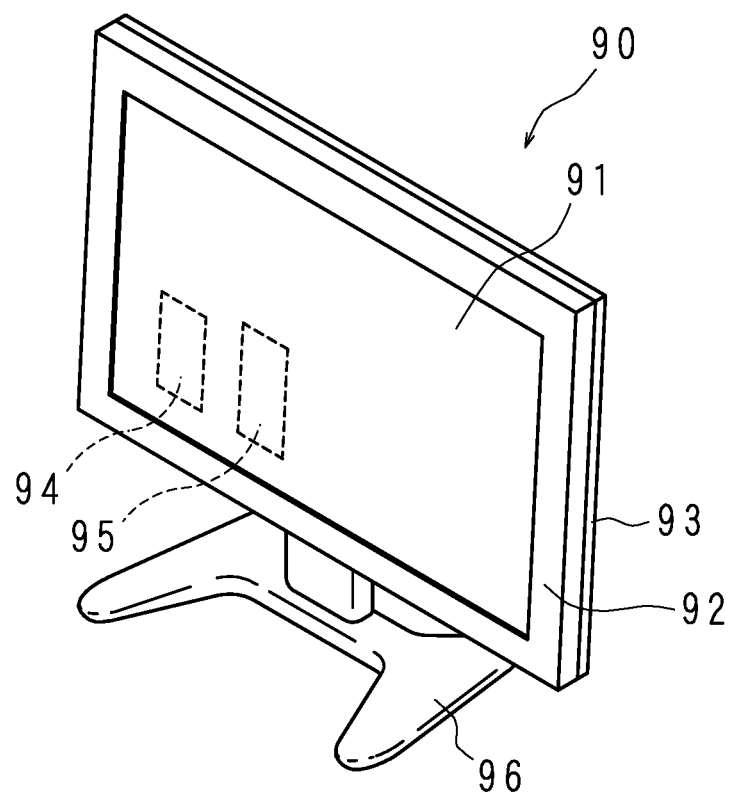
FIG. 1 is a schematic perspective view illustrating a TV receiver comprising a liquid crystal display apparatus (display module) according to the embodiment of the present invention.
Figure 2:
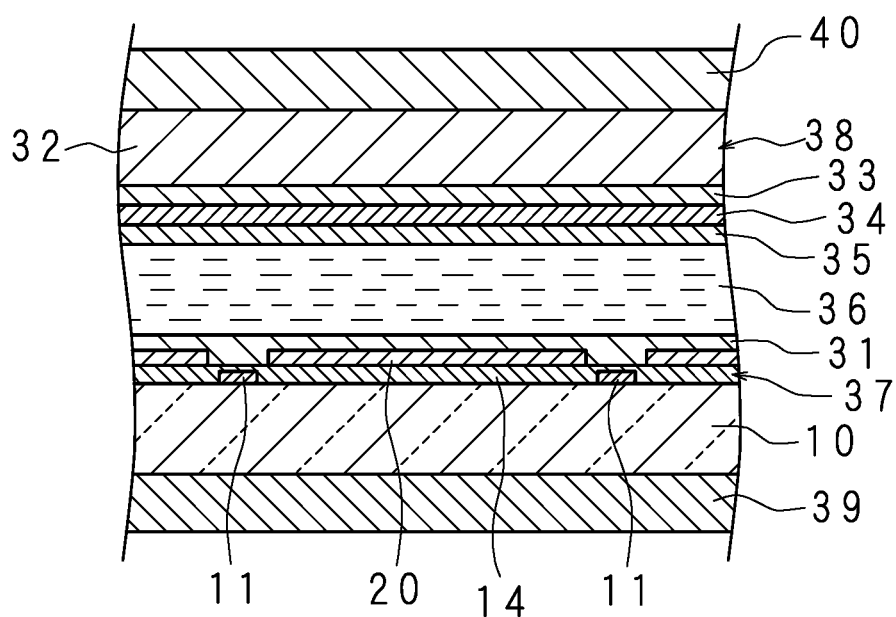
FIG. 2 is a schematic cross-sectional view illustrating a display panel included in the display module.

FIG. 1 is a schematic perspective view illustrating a TV receiver 90 comprising a liquid crystal display apparatus (display module 91) according to the embodiment of the present invention. FIG. 2 is a schematic cross-sectional view illustrating a display panel 30 included in the display module 91.

The TV receiver 90 comprises a laterally wide display module 91 for displaying an image, a tuner 94 for receiving the broadcast wave via an antenna (not depicted) and a decoder 95 for decoding the encoded broadcast wave. In the TV receiver 90, the decoder 95 decodes the broadcast wave received by the tuner 94 and, based on the decoded information, the display module 91 displays an image. A stand 96 for supporting the TV receiver 90 is provided at the bottom part of the TV receiver 90.

The display module 91 is accommodated in the vertical attitude inside a front cabinet 92 and a rear cabinet 93 arranged at the front and rear respectively in the vertical altitude. The front cabinet 92 is a rectangular frame body covering the peripheral part of the display module 91 and the rear cabinet 93 has a rectangular tray shape with its front side opened.

The display module 91 comprises a display panel 30, (the following elements are not depicted) a chassis with a substantial box shape, a light guide plate accommodated at the bottom surface of the chassis through a reflection sheet, a light emitting diode (LED) substrate provided at a side surface of the chassis to face a side surface of the light guide plate, and an optical sheet, for example three optical sheets, located on the front surface of the light guide plate. While the display module 91 according to the present embodiment is an edge light type, the display module 91 may be a direct type, which includes a diffusion plate instead of the light guide plate. In addition, the light source is not limited to the LED.

As illustrated in FIG. 2, the display panel 30 has substrates 10, 32 constituted by a pair of transparent glasses facing each other with a predetermined distance in between and a liquid crystal layer 36 interposed between these substrates 10, 32.

A gate wiring 11 is formed on the substrate 10 and an interlayer dielectric film 14 is formed to cover the substrate 10 and the gate wiring 11. Multiple pixel electrodes 20 are formed on the interlayer dielectric film 14 and a transparent alignment film 31 is formed to cover the pixel electrodes 20. The pixel electrode 20 is formed together with an active matrix. FIG. 2 illustrates the gate wiring 11 of the active matrix. The active matrix substrate (TFT substrate) 37 is configured to include the substrate 10, the gate wiring 11, the interlayer dielectric film 14 and the pixel electrode 20. The film between the interlayer dielectric film 14 and the pixel electrode 20 is not illustrated here.

On the substrate 32, a color filter 33, a common electrode 34 and an alignment film 35 are laminated in this order. A color filter substrate 38 is configured to include the substrate 32, the color filter 33 and the common electrode 34.

Additionally, the alignment films 31, 35 are bonded together with the liquid crystal layer interposed therebetween to fix the substrates 10, 32, and polarization plates 39, 40 are provided at the outer sides of the substrates 10, 32.

Figure 3:
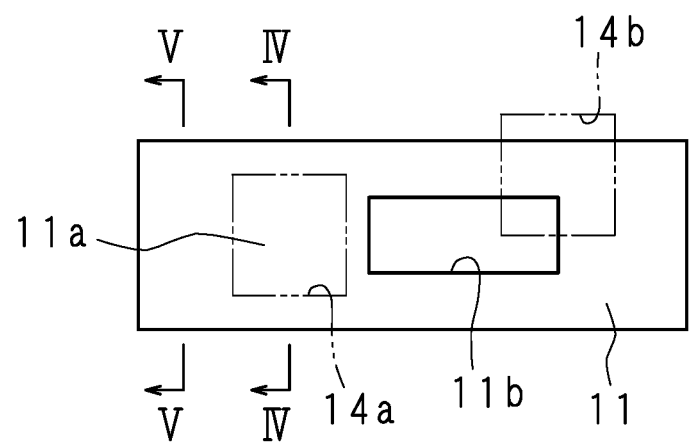
FIG. 3 is a plan view illustrating the relationship between a gate wiring and a contact hole and an adjustment hole of an interlayer dielectric film.
Figure 4:
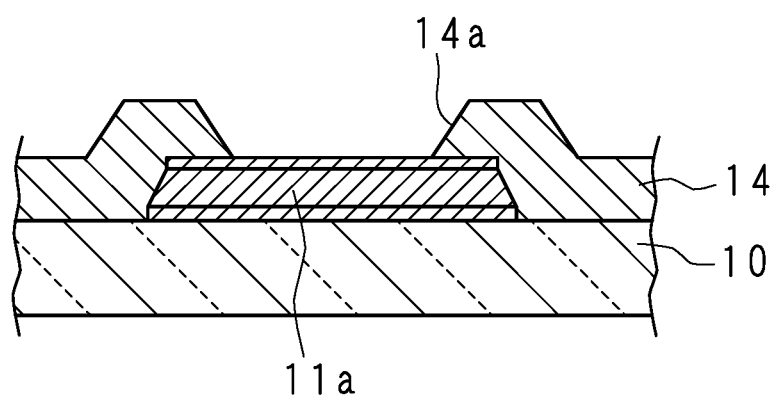
FIG. 4 is a cross-sectional view along the line IV-IV in FIG. 3.
Figure 5:
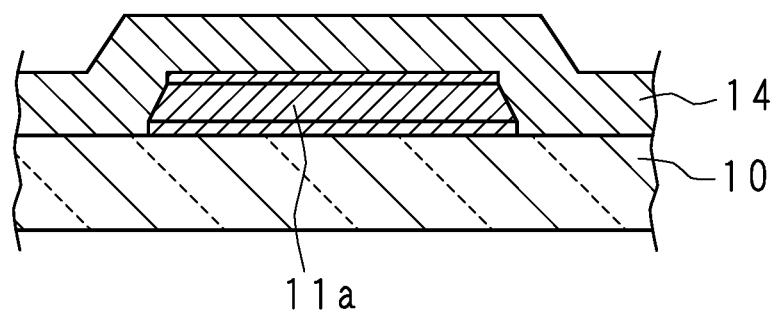
FIG. 5 is a cross-sectional view along the line V-V in FIG. 3.
Figure 6:
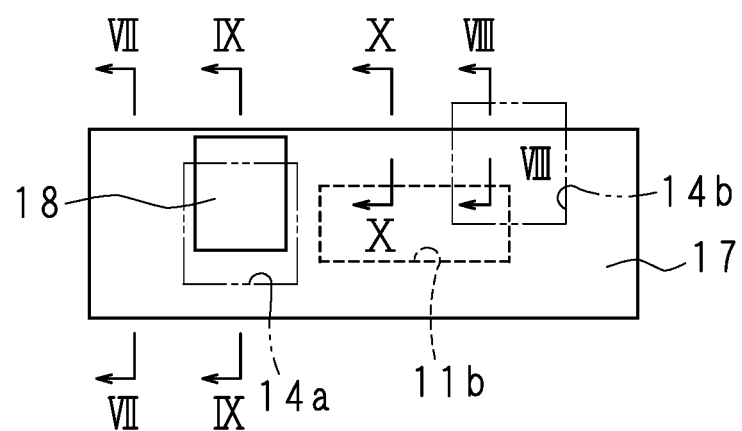
FIG. 6 is a plan view illustrating the relationship between a second semiconductor film and the contact hole and the adjustment hole of the interlayer dielectric film, when the second semiconductor film is formed.
Figure 7:
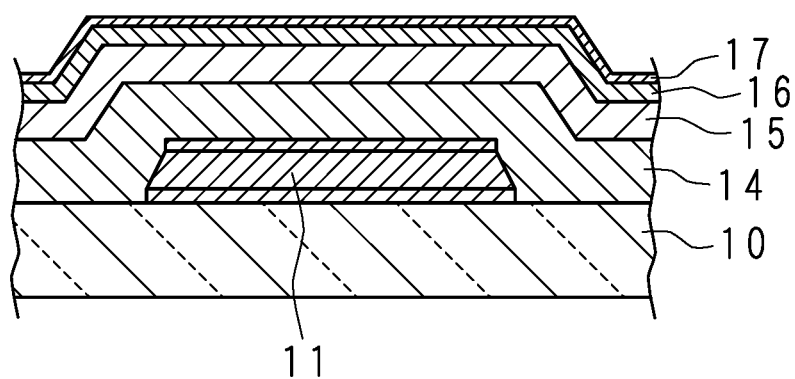
FIG. 7 is a cross-sectional view along the line VII-VII in FIG. 6.
Figure 8:
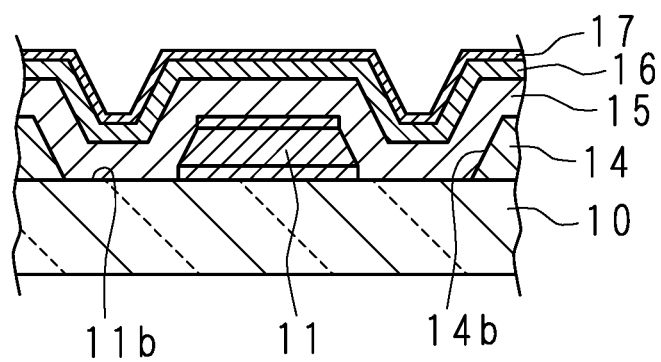
FIG. 8 is a cross-sectional view along the line VIII-VIII in FIG. 6.
Figure 9:
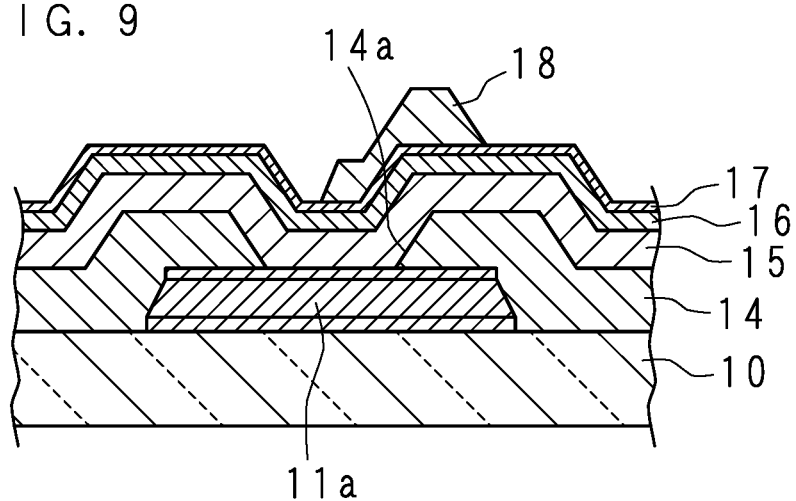
FIG. 9 is a cross-sectional view along the line IX-IX in FIG. 6.
Figure 10:
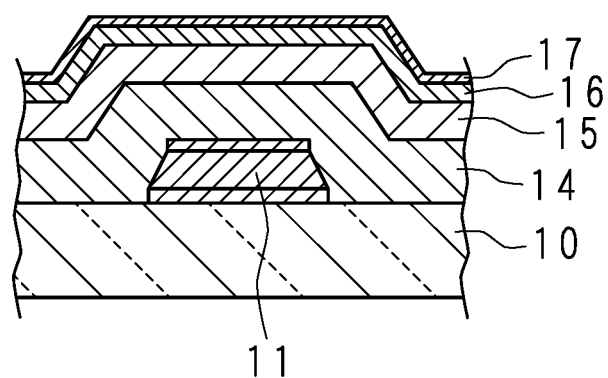
FIG. 10 is a cross-sectional view along the line X-X in FIG. 6.

FIG. 3 is a plan view illustrating the relationship between the gate wiring 11 of the active matrix substrate 37 and a contact hole 14a as well as an adjustment hole 14b of the interlayer dielectric film 14. FIG. 4 is a cross-sectional view along the line IV-IV in FIG. 3. FIG. 5 is a cross-sectional view along the line V-V-in FIG. 3. FIG. 6 is a plan view illustrating the relationship between the second semiconductor film 17 and the contact hole 14a as well as the adjustment hole 14b of the interlayer dielectric film 14 when the second semiconductor film 17 is formed. FIG. 7 is a cross-sectional view along the line VII-VII in FIG. 6. FIG. 8 is a cross-sectional view along the line VIII-VIII in FIG. 6. FIG. 9 is a cross-sectional view along the line IX-IX in FIG. 6. FIG. 10 is a cross-sectional view along the line X-X in FIG. 6.

The gate wiring 11 is formed on the substrate 10 of the active matrix substrate 37 to extend along the lateral direction in FIG. 3, as described below. A hole 11b that extends along the lateral direction in the state where the substrate 10 is exposed is formed at the substantially central part, illustrated in FIG. 3, of the gate wiring 11. One end part of the gate wiring 11 functions as a gate electrode 11a.

The interlayer dielectric film 14 is formed to cover the substrate 10, as described below. The interlayer dielectric film 14 is formed to extend from the substrate 10 to the peripheral part of the gate electrode 11a, and a contact hole 14a is provided at the inner side of the peripheral part.

In addition, a hole for alignment (adjustment hole) 14b is provided at the interlayer dielectric film 14 so as to expose the edge part at the upper right corner of the hole 11b, as illustrated in FIG. 3.

A gate insulation film 15 is formed on the interlayer dielectric film 14 and at the parts of the substrate 10 where the contact hole 14a, the hole 11b, and the adjustment hole 14b are provided. The gate insulation film 15 is formed, by deposition of a film using, for example, silicon oxide or silicon nitride with the Chemical Vapor Deposition (CVD) method and patterning of the film. Because of the thermal resistance to 350° C. or higher, the physical property of the interlayer dielectric film 14 remains unchanged even with the thermal history in the deposition process of the gate insulation film 15.

On the gate insulation film 15, a first semiconductor film 16 made of, for example, amorphous silicon and a second semiconductor film 17 made of, for example, n$^+$ amorphous silicon are formed in this order through the CVD method.

As illustrated in FIG. 9, a resist pattern 18 is formed to extend from the part over the contact hole 14a of the second semiconductor film 17 to the edge part. The edge of the resist pattern 18 is located at the inner side of the edge of the upper surface of the gate electrode 11a. The first semiconductor film 16 and the second semiconductor film 17 are patterned using the resist pattern 18.

A film made of Cu or the like is deposited using, for example, a sputtering method on the patterned second semiconductor film 17 or the gate insulation film 15 exposed by removal of the first semiconductor film 16 and the second semiconductor film 17, and the deposited film is patterned using a photolithography technique to form source metal (not depicted) including a source electrode and a source wiring.

Furthermore, for example, a film made of silicon nitride or the like is formed on the source metal using the CVD method and is then patterned to form a passivation film (not depicted), and a film made of, for example, acrylic resin is formed on the passivation film and is then patterned to form the second interlayer dielectric film (not depicted).

An ITO film is formed on the second interlayer dielectric film using, for example, the sputtering method and is then patterned to form the pixel electrode 20.

FIG. 11 is a schematic cross-sectional view illustrating the forming process of the interlayer dielectric film 14.

Figure 11A:
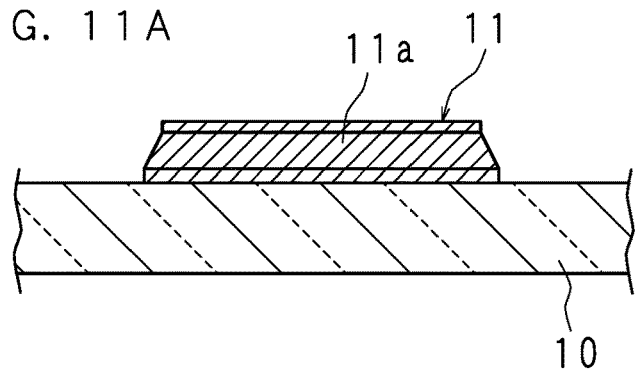
FIG. 11A is a schematic cross-sectional view illustrating a process of forming the interlayer dielectric film.

At first, a metal film in which, for example, a titanium film, a Cu film and a titanium film are laminated in this order is deposited on the entire substrate 10 using the sputtering method and then photolithography using a photomask, wet etching of the metal film and so forth are performed to form the patterned gate wiring (as well as the part constituting the gate electrode 11a) 11 (FIG. 11A).

Figure 11B:
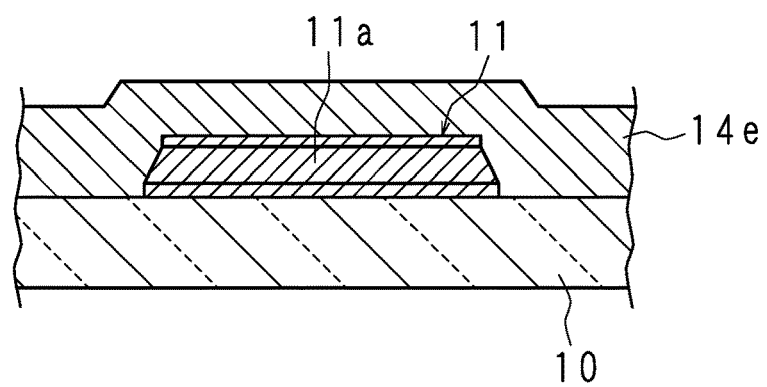
FIG. 11B is a schematic cross-sectional view illustrating the process of forming the interlayer dielectric film.

Next, the SOG material with photosensitivity is coated on the gate wiring 11 using a slit coating method to form a film 14e (FIG. 11B).

A composition including at least two kinds of polysiloxanes with different rates of solubility to tetramethylammonium hydroxide (TMAH) water solution, a diazonaphthoquinone derivative and a solvent can be listed herein as the SOG material.

Additionally, the mixture of polysiloxane (I) and polysiloxane (II) described below, for example, can be listed as the two kinds of polysiloxanes.

For the polysiloxane (I), a post-prebake film that is obtained by hydrolysis and condensation of the silane compound represented by the following formula (1) and the silane compound represented by the following formula (2)

under the presence of a basic catalyst is soluble to the 5 mass % TMAH solution, and the solubility thereof is 1,000 Å/sec or less.

(1)

(2)

(In the formulas, R represents a 1-20C straight-chain, branched or cyclic alkyl group in which any methylene may be replaced by oxygen, or a 6-20C aryl group in which any hydrogen may be replaced by fluorine, and $R^1$ represents a 1-5C alkyl group.)

As a concrete example of the silane compound represented by the formula (1), methyl trimethoxysilane, methyltriethoxysilane, phenyltrimethoxysilane, phenyltriethoxysilane, etc. can be listed.

As a concrete example of the silane compound represented by the formula (2), a tetramethoxysilane, a tetraethoxysilane, etc. can be listed.

For polysiloxane (II), a solubility with respect to a 2.38 mass % TMAH solution of a post-prebake film that is obtained by hydrolysis and condensation of at least the silane compound represented by the formula (1) under the presence of an acid or basic catalyst is 100 Å/sec or more.

After forming the film 14e, the film thickness is adjusted by, for example, 90 seconds prebaking at 100° C.

After the prebaking, the film 14e is exposed to light through a photomask and then developed with a 2.38% TMAH solution. The pattern in which the part of the contact hole 14a is removed without any residue is thereby formed.

Figure 11C:
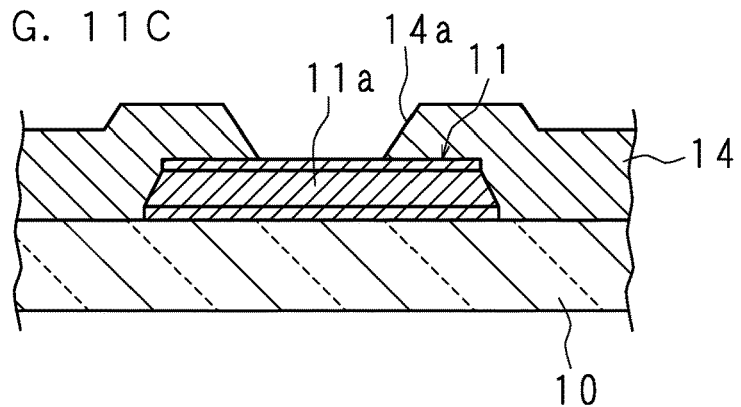
FIG. 11C is a schematic cross-sectional view illustrating the forming process of the interlayer dielectric film.

After that, the film 14e is hardened to obtain the interlayer dielectric film 14 by, for example, post-baking at 250° C. (FIG. 11C).

In the present embodiment, because the interlayer dielectric film 14 is formed using the SOG material with photosensitivity, dry etching is not required for forming the film, which can avoid etching of the surface of the substrate 10 and abnormal electric discharge that appears in the prior art active matrix substrate. Therefore, the adjustment hole 14b can be provided at the interlayer dielectric film 14 except for the part on the gate wiring 11.

When the resist pattern 18 is formed on the second semiconductor film 17, as illustrated in FIGS. 6 to 10, the edge of the gate electrode 11a is visible through the adjustment hole 14b. The deviation of the position of the resist pattern 18 from the edge is measured, the photoresist is formed again based on the measured deviation, exposed to light using a photomask and then developed, the resist pattern 18 is formed again, and the parts of the first semiconductor film 16 and the second semiconductor film 17 on which the resist pattern 18 is not present are etched, so that the first semiconductor film 16 and the second semiconductor film 17 can be patterned.

In addition, when forming the source metal on the patterned second semiconductor film 17, the position of resist pattern formed on the source metal with respect to the gate wiring 11 can be checked through the adjustment hole 14b so that the resist pattern can be adjusted to pattern the source metal.

The gate insulation film 15 may be formed while checking the position of the edge of the gate wiring 11 through the adjustment hole 14b. The first semiconductor film 16 and the second semiconductor film 17 as well as the source metal can also be formed while checking the position of the edge of the gate wiring 11, as described above.

In other words, the overlaying can be adjusted based on the pattern of the film of the gate wiring 11, which improves the overlaying precision.

The active matrix substrate 37 can be manufactured in the situation that the position adjustment is facilitated, the number of condition settings can be decreased, the occurrence of defects is reduced and the yield is improved.

Because the positioning precision at depositing the films of the active matrix substrate 37 is improved, it is possible to increase the definition and size of the display module 91 comprising the active matrix substrate 37 according to the present embodiment.

Embodiment 2

The active matrix substrate according to Embodiment 2 of the present invention has the configuration similar to the active matrix substrate 37 according to Embodiment 1, except for the interlayer dielectric film 14 having two adjustment holes.

Figure 12:
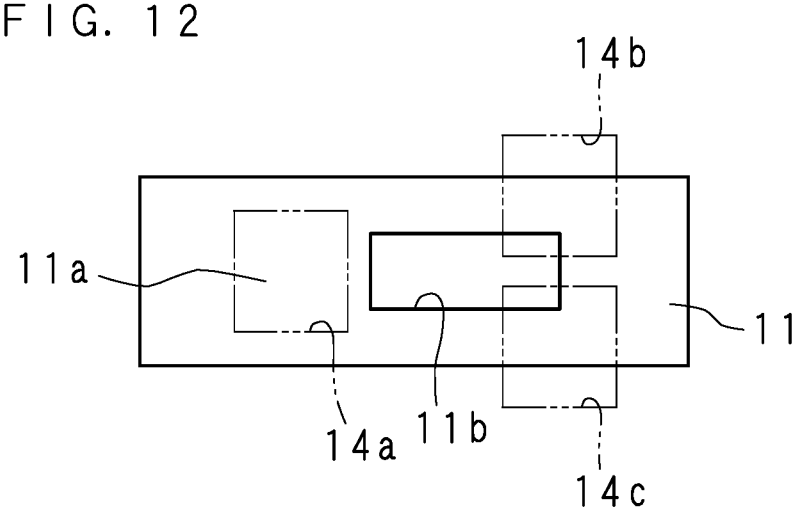
FIG. 12 is a plan view illustrating the relationship between the gate wiring and the contact hole as well as the adjustment hole of the interlayer dielectric film.
Figure 13:
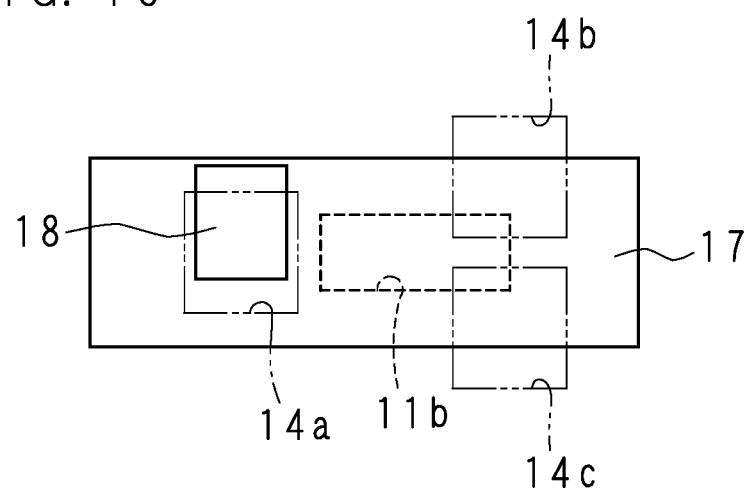
FIG. 13 is a plan view illustrating the relationship between the second semiconductor film and the contact hole as well as the adjustment hole, when the second semiconductor film is formed.

FIG. 12 is a plan view illustrating the relationship between the gate wiring 11 and the contact hole 14a, the adjustment holes 14b and 14c of the interlayer dielectric film 14. FIG. 13 is a plan view illustrating the relationship between the second semiconductor film 17 and the contact hole 14a, the adjustment holes 14b and 14c, when the second semiconductor film 17 is formed.

In addition to the adjustment hole 14b, the adjustment hole 14c is formed at the interlayer dielectric film 14 so as to expose the edge part of the lower right corner of the hole 11b of the gate wiring 11, which is illustrated in FIG. 12.

In the present embodiment, because the interlayer dielectric film 14 has the two adjustment holes 14b, 14c, the alignment, for example, in the lateral and longitudinal directions can be adjusted through the respective adjustment holes, based on two edges of the gate wiring 11 which is the lowest layer provided right over the substrate 10. The overlaying of all the films formed over the gate wiring 11 can be more certainly adjusted. Therefore, the overlaying precision is more improved.

Embodiment 3

The active matrix substrate according to Embodiment 2 of the present invention has the configuration similar to the active matrix substrate 37 according to Embodiment 1, except for the different shape and size of the contact hole 14d formed at the interlayer dielectric film 14.

Figure 14:
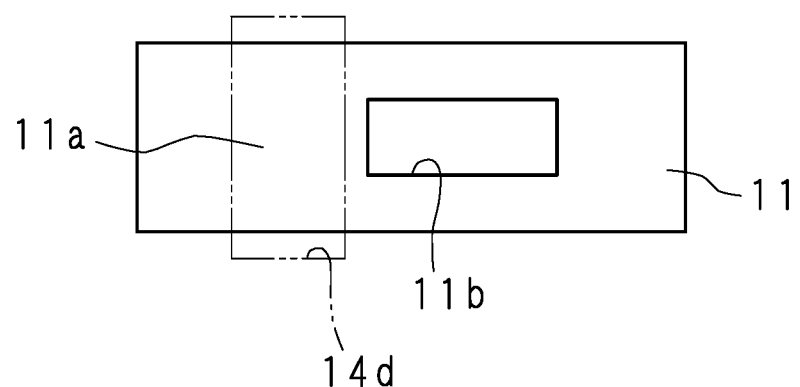
FIG. 14 is a plan view illustrating the relationship between the gate wiring and the contact hole of the interlayer dielectric film.
Figure 16:
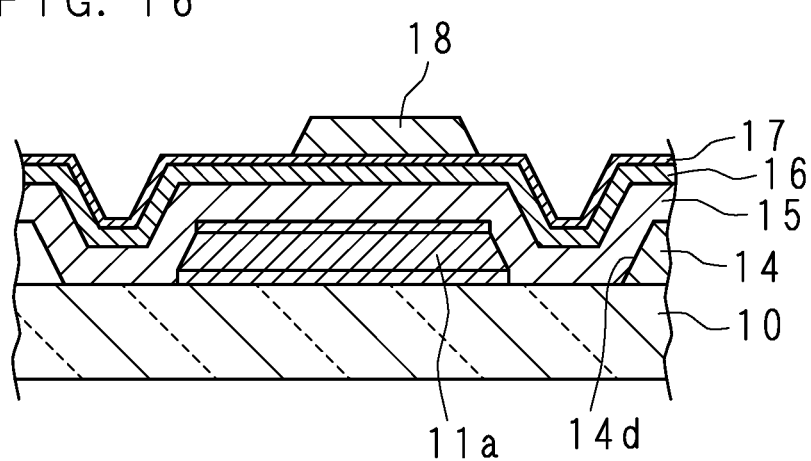
FIG. 16 is a cross-sectional view along the line XVI-XVI in FIG. 15.

FIG. 14 is a plan view illustrating the relationship between the gate wiring 11 and the contact hole 14d of the interlayer dielectric film 14. FIG. 15 is a plan view illustrating the relationship between the second semiconductor film 17 and the contact hole 14d, when the second semiconductor film 17 is formed. FIG. 16 is a cross-sectional view along the line XVI-XVI in FIG. 15.

As illustrated in FIGS. 14 and 15, the contact hole 14d of the interlayer dielectric film 14 is formed to be larger than the width of the gate wiring 11. As illustrated in FIG. 16, the gate insulation film 15 is formed on the interlayer dielectric film 14, the bottom surface of the contact hole 14d and the gate wiring 11, and the first semiconductor film 16 and the second semiconductor film 17 are formed on the gate insulation film 15 in this order. The resist pattern 18 is provided on the part of the second semiconductor film 17 above the contact hole 14d.

In the present embodiment, the edge of the gate wiring 11 at the contact hole 14d is viewed while the deviation of the position of the resist pattern 18 from the edge is measured, and the resist pattern 18 is formed again to pattern the first semiconductor film 16 and the second semiconductor film 17.

Additionally, when the source metal film is formed and patterned on the patterned second semiconductor film 17, the patterning of the source metal film can be also adjusted while viewing the edge of the gate wiring 11 at the contact hole 14*d*.

Embodiment 4

In the present embodiment, the interlayer dielectric film 14 is formed only on the crossing portion of the gate wiring 11 and the source metal 12.

Figure 17:
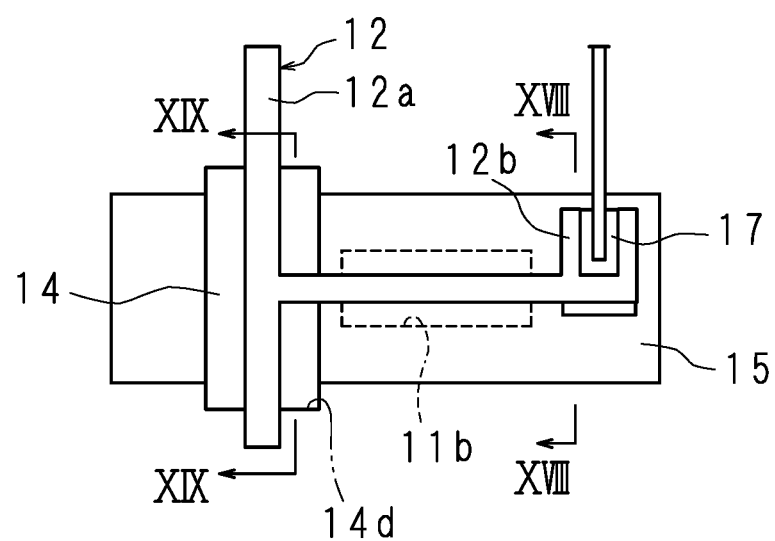
FIG. 17 is a plan view illustrating the forming positions of the gate wiring, the interlayer dielectric film and the source wiring.
Figure 18:
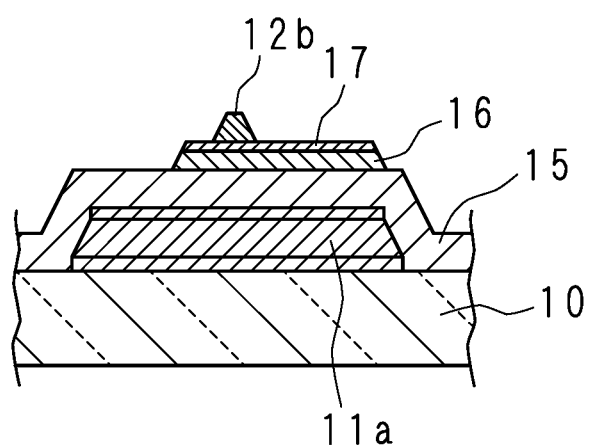
FIG. 18 is a cross-sectional view along the line XVIII-XVIII in FIG. 17.
Figure 19:
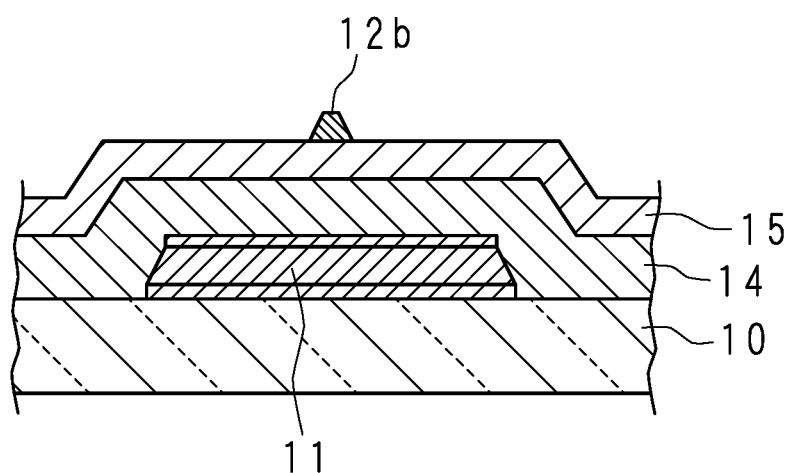
FIG. 19 is a cross-sectional view along the line XIX-XIX in FIG. 17.
Figure 20:
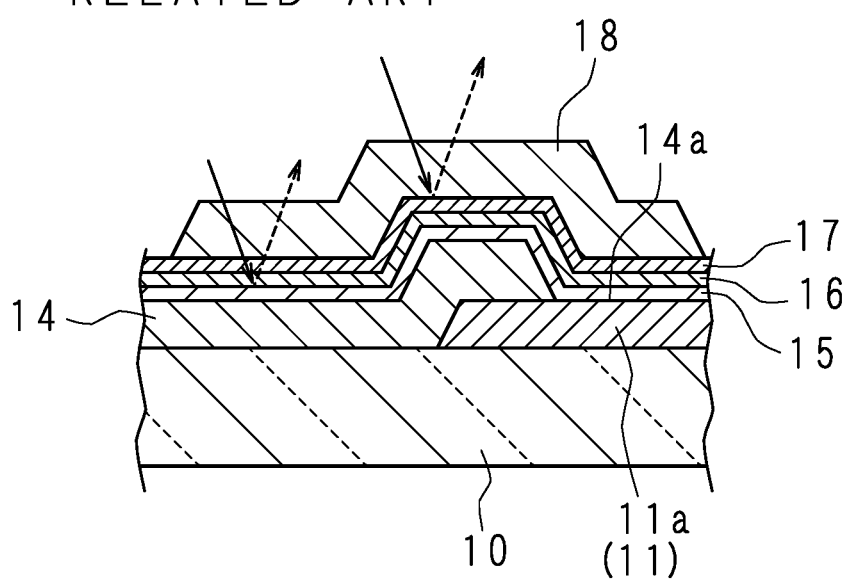
FIG. 20 is a schematic cross-sectional view illustrating a portion of a TFT structure of a prior art active matrix substrate according to Japanese Patent No. 4450834, etc.
Figure 21A:
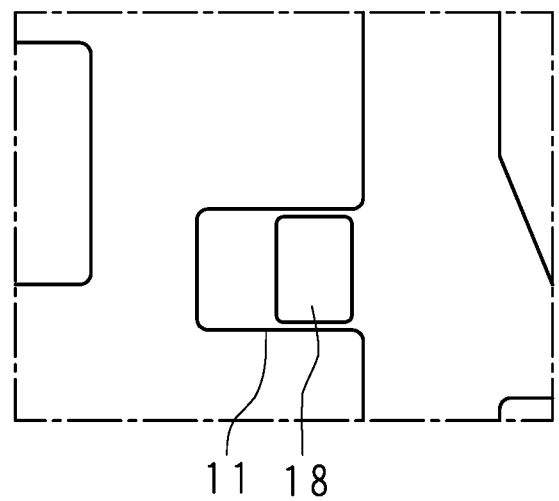
FIG. 21A is a schematic view illustrating the relationship between the positions of a resist pattern and the gate wiring in the case where the interlayer dielectric film is absent.
Figure 21B:
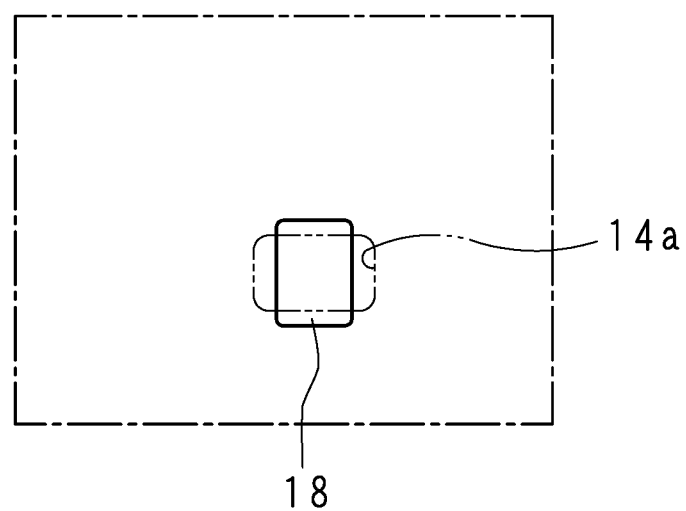
FIG. 21B is a schematic view illustrating the resist pattern in the case where the interlayer dielectric film 14 is present.

FIG. 17 is a plan view illustrating the forming positions of the gate wiring 11, the interlayer dielectric film 14, and the source wiring 12*a*. FIG. 18 is a cross-sectional view along the line XVIII-XVIII in FIG. 17. FIG. 19 is a cross-sectional view along the line XIX-XIX in FIG. 17.

The interlayer dielectric film 14 is formed only on the crossing point of the gate wiring 11 and the source wiring 12*a*.

The gate insulation film 15 is formed on the interlayer dielectric film 14 as well as the portions of substrate 10 and the gate wiring 11 on which the interlayer dielectric film is not present.

The first semiconductor film 16 and the second semiconductor film 17 are formed on the gate insulation film 15 which is formed on the gate electrode 11*a*, and the source electrode 12*b* is formed on the second semiconductor film 17.

In the present embodiment, because the interlayer dielectric film 14 is formed only at the crossing portion of the gate wiring 11 and the source wiring 12, the patterning can be adjusted while viewing the edge of the gate wiring 11, when forming the first semiconductor film 16 and the second semiconductor film 17 and when forming the source wiring 12*a* and the source electrode 12*b*.

It is to be noted that, as used herein and in the appended claims, the singular forms "a", "an", and "the" include plural referents unless the context clearly dictates otherwise.

It should be understood that the embodiments disclosed herein are illustrative and non-restrictive in every respect. Since the scope of the present invention is defined by the appended claims rather than by the description preceding them, and all changes that fall within metes and bounds of the claims, or equivalence of such metes and bounds thereof are therefore intended to be embraced by the claims.

For example, the laminated structure of the active matrix substrate is not limited to the one described above, and any appropriate material can be used for the film, except that the interlayer dielectric film 14 is formed of the SOG material with photosensitivity.

The invention claimed is:

1. A method of manufacturing an active matrix substrate, the method comprising:
   forming, on a base substrate, a gate wiring and a source wiring which crosses the gate wiring above the gate wiring;
   forming a thin film transistor near a region where the gate wiring and the source wiring face each other;
   forming an interlayer dielectric film containing a spin-on-glass (SOG) material having photosensitivity in at least an area between the gate wiring and the source wiring in the region;
   forming a hole in the interlayer dielectric film at a position overlapping only one of two outer edges along the longitudinal direction of the gate wiring formed on the base substrate so that a boundary viewed from above between the base substrate and the gate wiring is visually recognized through the hole; and
   forming a semiconductor film after the interlayer dielectric film is formed,
   wherein the method further comprises:
   viewing the position of the boundary through the hole;
   forming a film after the interlayer dielectric film is formed while adjusting a position of the film formed after the interlayer dielectric film based on the position of the boundary viewed through the hole.

2. The method according to claim 1, wherein a source metal which includes the source wiring or a source electrode is formed after the semiconductor film is formed.

3. The method according to claim 1, wherein the SOG material contains a diazonaphthoquinone derivative, a solvent and at least two kinds of polysiloxanes with different rates of solubility to tetramethylammonium hydroxide water solution.

4. The method according to claim 2, wherein the SOG material contains a diazonaphthoquinone derivative, a solvent and at least two kinds of polysiloxanes with different rates of solubility to tetramethylammonium hydroxide water solution.

5. The method according to claim 1, wherein the interlayer dielectric film is formed after the gate wiring is formed, and a gate insulation film is formed after the interlayer dielectric film is formed.

6. The method according to claim 5, wherein the gate insulation film is formed so as to plug the hole contained in the interlayer dielectric film.

* * * * *